(12) United States Patent
Furst et al.

(10) Patent No.: US 6,362,969 B1
(45) Date of Patent: Mar. 26, 2002

(54) ARRANGEMENT FOR SUPPORTING A CIRCUIT BOARD

(75) Inventors: Wilhelm Furst, Sengenthal; Bernhard Kratz, Wendelstein, both of (DE)

(73) Assignee: Diehl Stiftung & Co., Nuremberg (DE)

( * ) Notice: Subject to any disclaimer, the term of this patent is extended or adjusted under 35 U.S.C. 154(b) by 0 days.

(21) Appl. No.: 09/418,759

(22) Filed: Oct. 15, 1999

(30) Foreign Application Priority Data

Oct. 15, 1998 (DE) .......................................... 198 47 521

(51) Int. Cl.⁷ ................................................. H05K 5/00
(52) U.S. Cl. ...................... 361/752; 361/753; 361/704; 361/707; 361/720; 248/562
(58) Field of Search ................ 361/701–711, 712–714, 361/740, 742, 752, 753, 749, 807, 809, 810; 174/138 G; 248/560–562

(56) References Cited

U.S. PATENT DOCUMENTS

| | | | | |
|---|---|---|---|---|
| 4,245,356 A | * | 1/1981 | Hallford | 455/327 |
| 4,475,145 A | * | 10/1984 | Heil et al. | 361/386 |
| 4,627,677 A | * | 12/1986 | Ono et al. | 339/17 M |
| 5,375,039 A | * | 12/1994 | Wiesa | 361/720 |
| 5,812,375 A | * | 9/1998 | Casperson | 361/707 |
| 6,058,013 A | * | 5/2000 | Christopher et al. | 361/704 |
| 6,201,691 B1 | * | 3/2001 | Nagarajan | 361/586 |

FOREIGN PATENT DOCUMENTS

| | | |
|---|---|---|
| DE | 3401513 C2 | 12/1987 |
| DE | 4112831 A1 | 10/1992 |
| DE | 4343127 A1 | 6/1994 |
| GB | 2153052 B | 8/1985 |

OTHER PUBLICATIONS

Elastogran Kunststoff–Technik (BASF), "Kunststoff–Technik GmbH, Lemforde" Brochure EKT 0029–3–79 and 0027–6–81/1 (1979 & 1980).

* cited by examiner

*Primary Examiner*—Jayprakash N. Gandhi
*Assistant Examiner*—Tuan Dinh
(74) *Attorney, Agent, or Firm*—Scully, Scott, Murphy & Presser

(57) ABSTRACT

Described is an arrangement for supporting a circuit board (28) having functional components (30) on a carrier (16) of a projectile (10). The carrier (16) has a metal plate (18). The circuit board (28) comprises a carbon fibre-reinforced plastic material. Provided between the circuit board (28) and the metal carrier plate (18) is an elastic damping layer (26). The circuit board (28) and the damping layer (26)—like the metal carrier plate (18)—are spaced with their peripheral edges from the inside wall of the housing of the projectile (10).

8 Claims, 1 Drawing Sheet

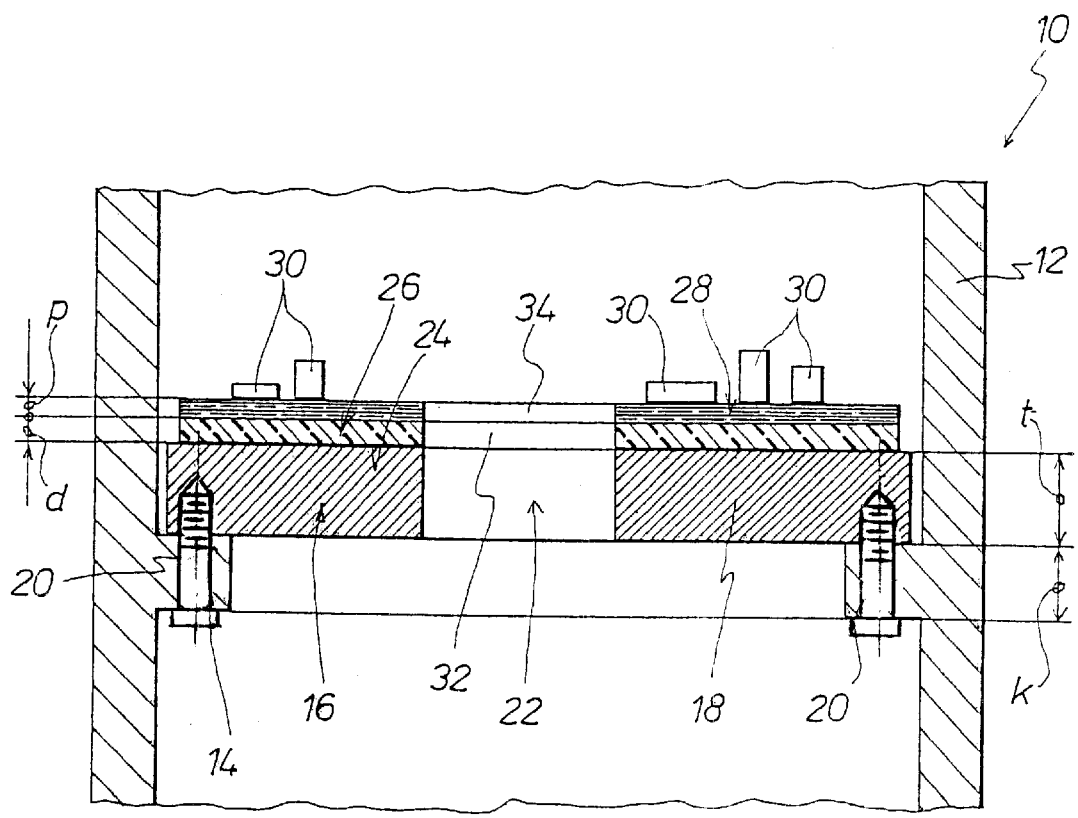

ARRANGEMENT FOR SUPPORTING A CIRCUIT BOARD

BACKGROUND OF THE INVENTION

1. Field of the Invention

The invention concerns an arrangement for supporting a circuit board having functional components which are located on a carrier on a projectile.

2. Discussion of the Prior Art

DE 34 01 513 C2 discloses a projectile or missile in which an electronic firing circuit is disposed in a fuse housing which is fixed to the projectile casing. In that arrangement the firing circuit is foamed into a plastic material hard foam block. Fitted into the fuse housing are flat elastic damping bodies which jointly enclose the hard foam block on all sides.

A disadvantage with the operation of embedding the circuit into the block by foaming is that the mobility of functional components which must be movable can be adversely affected. Another detrimental aspect is that, when the material foams up, mechanical stresses can occur between the functional components and the circuit board, and such stresses can possibly result in the electrical connection between the functional components and the circuit board being torn away. Similar disadvantages occur if the circuit board and the functional parts or components are cast or moulded into a block.

In order to obviate those disadvantages. DE 41 12 831 A1 discloses an arrangement for supporting functional components or parts which are arranged on a circuit board, in a carrier body, in particular in a projectile, wherein the circuit board and the functional components are disposed within an opening in the carrier body. Fitted into the opening is a shaped member which is prefabricated from a compressible plastic material and the profile of which is approximately adapted to the functional components. The shaped member is squeezed against the walls of the opening by a cover for the mouth aperture of the opening so that the functional components are held against the circuit board. That known support arrangement involves force components in a radial direction, and that, having regard to the extremely high acceleration forces which occur in the case of a projectile, can give rise to major problems in regard to operational reliability of the circuit board or the functional components provided thereon.

SUMMARY OF THE INVENTION

In consideration of those factors the object of the present invention is to provide an arrangement of the kind set forth in the opening part of this specification for operationally reliably holding the functional components under the extremely high acceleration forces which occur in the case of a projectile or missile.

It has surprisingly been found that the configuration according to the invention such that the circuit board comprises a carbon fibre-reinforced plastic material, wherein an elastic damping layer is provided between the circuit board and the carrier, and that the circuit board and the damping layer are spaced with their peripheral edges from the inside wall of the projectile, prevents high force components being built up in the radial direction, so that acceleration-induced damage to the circuit board or the functional components provided thereon is avoided in a simple fashion. In accordance with the invention this advantageous quality can be still further promoted by virtue of the fact that the carrier has a metal plate which is fixed in the projectile, bridging over the cross-section thereof, In accordance with the invention the metal carrier plate is preferably formed with a through hole.

The elastic damping layer provided between the circuit board and the metal carrier plate, and in particular the metal carrier plate itself, serve to carry the axial force components of the acceleration forces. In accordance with the invention the operational reliability of the circuit board is improved in comparison with known arrangements of the general kind set forth, in that it comprises a carbon fibre-reinforced plastic material.

It has proven to be particularly desirable for the metal carrier plate to be of a thickness which is many times greater than the thickness of the circuit board and the elastic damping layer. In that case the damping layer and the circuit board may be of thicknesses which are at least approximately matched to each other. It will be appreciated that it is also possible for the damping layer and the circuit board to be of thicknesses which are different from each other or for the damping layer to be thicker than the circuit board.

In order to eliminate radial force components not just by virtue of the provision in the metal carrier plate of a through hole which is preferably provided in a central region of the metal carrier plate, it is desirable if the circuit board and the damping layer are also formed with holes. The last-mentioned holes can be in overlapping relationship with the through hole in the metal carrier plate. In that respect, the holes in the circuit board and in the damping layer and the through hole in the metal carrier plate can be at least approximately coincident with each other. Such a configuration of the above-described kind reliably eliminates radial force components resulting from the extremely high acceleration force of a projectile or missile so that damage to the circuit board or the functional components provided thereon can be reliably excluded.

The metal carrier plate of the support arrangement according to the invention can be fixed to a projecting mounting portion or bracket which radially protrudes into the projectile. The projecting mounting portion can be in the form of a collar or shoulder which extends peripherally in the interior of the projectile.

Desirably the metal carrier plate is screwed to the above-mentioned projecting mounting portion in the axial direction of the projectile. That affords the advantage of ease of assembly.

Desirably the projecting mounting portion is dimensioned with an axial dimension which is adapted to the thickness of the metal carrier plate in order suitably to optimise mechanical strength in the axial direction.

In the case of the support arrangement according to the invention it has been found advantageous for the damping layer to comprise a cellular polyurethane elastomer (PUR). Such a polyurethane elastomer is described for example in a company prospectus from Elastogran Kunststoff-Technik GmbH, Lemforde, Germany "Elastogran Kunststoff-Technik, EKT 0029 -3-79 or 0027-6-81/1".

BRIEF DESCRIPTION OF THE DRAWING

Further details, features and advantages will be apparent from the following description of an embodiment, diagrammatically shown as a sectional view in the drawing, of a projectile or missile of which a portion is shown with a support arrangement according to the invention.

DETAILED DESCRIPTION OF A PREFERRED EMBODIMENT

The FIGURE is a view in longitudinal section of a portion of a projectile or missile 10, from the wall 12 of which a peripherally extending protruding mounting portion 14 projects integrally radially inwardly. Screwed fast to the projecting mounting portion 14 is a carrier 16 which is formed by a metal plate 18. The screwing of the metal carrier plate 18 to the projecting mounting portion 14 which extends in the peripheral direction in the interior of the projectile 10 is diagrammatically indicated by thin dash-dotted lines 20 representing the centre lines of suitable screws.

The metal carrier plate 18 is provided with a through hole 22 in a central region.

An elastic damping layer 26 is provided on the main surface 24 of the metal carrier plate 18, which main surface faces away from the projecting mounting portion 14. Arranged on the damping layer 26 is a circuit board 28 having electrical or electronic functional components 30. The damping layer 26 preferably comprises a cellular polyurethane elastomer (PUR) and the circuit board 28 preferably comprises a carbon fibre-reinforced plastic material. The damping layer 26 and the circuit board 28 are provided with holes 32 and 34 which are coincident with the through hole 22 in the metal carrier plate 18. The damping layer 26, the circuit board 28 and metal carrier plate 18 are spaced with their peripheral edges from the inside wall of the housing of the projectile so that force components in the radial direction between the housing of the projectile 10 and the circuit board 28 are avoided.

The projecting mounting portion 14 which extends around the projectile 10 in the interior thereof is of a thickness k and the metal carrier plate 18 is of a thickness t. The thicknesses k and t are desirably at least approximately equal. The damping layer 26 is of a thickness d and the circuit board 28 is of a thickness p. The thicknesses d and p can be adapted to each other, that is to say they can be at least approximately equal, but it is for example also possible for the thickness of the elastic damping layer 26 to be greater than the thickness p of the circuit board 28.

List of reference numerals 10 projectile
12 wall (of 10)
14 projecting mounting portion (in 10)
16 carrier (on 14)
18 metal plate (of 16)
20 dash-dotted lines
22 through hole (in 18)
24 main surface (of 18)
26 damping layer (on 18)]
28 circuit board (on 26)
30 functional components (on 28)
32 hole (in 26)
34 hole (in 28)

What is claimed is:

1. A projectile (10) including a shock-absorbently installed circuit board (28) for operational components (30), said circuit board (28) being mounted on a metal plate (18), a damping layer (26) being interposed between said circuit board and said metal plate, said metal plate (18) having a thickness (t) which exceeds by a multiple the total thickness (p+d) for the combined circuit board (28) and damping layer (26), said metal plate (18), in a direction of an axial accerating force acting on the projectile, being supported on an inwardly projecting mounting portion (14) peripherally extending along an inner wall (12) of said projectile, wherein said circuit board (28), damping layer (26) and metal plate (18) maintain a distance from the inner wall (12) of said projectile along their peripheral edges so as to preclude radial force components acting thereon which are encountered along the direction of the axial accerating forces.

2. A projectile as claimed in claim 1, wherein said damping layer (26) and said circuit board (28) have at least similar thicknesses (d, p).

3. A projectile as claimed in claim 1 or 2, wherein said mounting portion (14) extending about the inner wall of said projectile has in an axial direction thereof approximately the same dimension as the thickness (t) of said metal plate (18).

4. A projectile as claimed in claim 1, wherein said metal plate (18) is fastened to said mounting portion (14) by screw members (20) which extend in parallel with a longitudinal axis of said projectile.

5. A projectile as claimed in claim 1, wherein said metal plate (18) possesses a through hole (22).

6. A projectile as claimed in claim 5, wherein said circuit plate (28) and said damping layer (26) each include holes (34, 32) which at least partially overlap the hole (22) in said metal plate (18).

7. A projectile as claimed in claim 5, wherein said circuit plate (28) and said damping layer (26) each include holes (34, 32) which are formed so as to be in substantial alignment with the hole (22) in said metal plate.

8. A projectile as claimed in claim 1, wherein said damping layer (26) comprises a cellular polyurethane elastomer (PUR).

* * * * *